United States Patent [19]

Rossman et al.

[11] Patent Number: 5,153,323

[45] Date of Patent: Oct. 6, 1992

[54] HALOMETHYL-1,3,5-TRIAZINES CONTAINING A PHOTOINITIATOR MOIETY

[75] Inventors: Mitchell A. Rossman; James A. Bonham, both of St. Paul, Minn.

[73] Assignee: Minnesota Mining and Manufacturing Company, St. Paul, Minn.

[21] Appl. No.: 680,025

[22] Filed: Mar. 28, 1991

Related U.S. Application Data

[63] Continuation of Ser. No. 441,181, Nov. 22, 1989, abandoned, which is a continuation-in-part of Ser. No. 241,339, Sep. 7, 1988, abandoned.

[51] Int. Cl.⁵ ............... C07D 251/40; C07D 251/18
[52] U.S. Cl. ...................... 544/194; 544/204; 544/208; 544/211; 544/216; 544/219; 522/63; 522/69
[58] Field of Search ............ 544/194, 204, 208, 211, 544/216, 219; 522/63, 69

[56] References Cited

U.S. PATENT DOCUMENTS

| | | | |
|---|---|---|---|
| 2,722,512 | 11/1955 | Crandall | 204/158 |
| 3,046,127 | 7/1962 | Barney et al. | 96/35 |
| 3,814,607 | 6/1974 | Nebe | 96/115 P |
| 3,847,771 | 11/1974 | McGinniss | 204/159.24 |
| 3,905,815 | 11/1975 | Bonham | 96/68 |
| 3,915,824 | 10/1975 | McGinniss | 204/159.23 |
| 3,954,475 | 5/1976 | Bonham et al. | 96/67 |
| 3,987,037 | 10/1976 | Bonham et al. | 260/240 D |
| 4,113,497 | 9/1978 | Schlesinger | 96/115 P |
| 4,181,752 | 1/1980 | Martens et al. | 427/54.1 |
| 4,189,323 | 2/1980 | Buhr | 430/281 |
| 4,239,850 | 12/1980 | Kita et al. | 430/281 |
| 4,259,432 | 3/1981 | Kondoh et al. | 430/281 |
| 4,264,709 | 4/1981 | Newland et al. | 430/281 |
| 4,366,228 | 12/1982 | Specht et al. | 430/281 |
| 4,391,687 | 7/1983 | Vesley | 204/159.16 |
| 4,476,215 | 10/1984 | Kausch | 430/281 |
| 4,505,793 | 3/1985 | Tamoto et al. | 204/159.16 |
| 4,696,888 | 9/1987 | Buhr | 522/63 |
| 4,758,497 | 7/1988 | Shah et al. | 430/193 |
| 4,772,534 | 9/1988 | Kawamura et al. | 522/63 |
| 4,837,128 | 6/1989 | Kawamura et al. | 522/63 |

FOREIGN PATENT DOCUMENTS

0305115  3/1989  European Pat. Off. ............ 430/281

*Primary Examiner*—Mary Lee
*Assistant Examiner*—Joseph K. McKane
*Attorney, Agent, or Firm*—Gary L. Griswold; Walter N. Kirn; David L. Weinstein

[57] ABSTRACT

Radiation-sensitive organo-halogen compounds having a photo-labile halomethyl-1,2,5-triazine moiety and at least one photoinitiator moiety within one molecule. The compounds of this invention are good photoinitiators, and compositions containing them can be used in printing, duplicating, copying, and other imaging systems. The compounds of this invention eliminate the need for a combination of photoinitiators in a photocurable or photopolymerizable composition.

11 Claims, No Drawings

HALOMETHYL-1,3,5-TRIAZINES CONTAINING A PHOTOINITIATOR MOIETY

The is a continuation of application Ser. No. 07/44,181 filed Nov. 22, 1989 now abandoned, which is a continuation-in-part of application Ser. No. 07/241,339 filed Sep. 7, 1988 now abandoned.

BACKGROUND OF THE INVENTION

1. Field of the Invention

This invention relates to photosensitive compounds, more particularly, derivatives of halomethyl-1,3,5-triazines.

2. Discussion of the Prior Art

Compounds that decompose to generate free radicals (free radical generating agents) upon exposure to light are well known in the graphic arts. Organic halogen compounds, which are capable of generating free radicals such as a chlorine free radical or a bromine free radical upon exposure to light, have been widely used as photoinitiators in photopolymerizable compositions, as photoactivators in free radical photographic compositions, and as photoinitiators for reactions catalyzed by acids formed by light. The spectral sensitivity of these compositions may be broadened by the addition of sensitizers which, in essence, transfer their absorbed energy to the organic halogen compound. The use of such halogen compounds in photopolymerization processes and free radical photographic processes has been described in Kosar, *Light-Sensitive Systems*, J. Wiley & Sons (New York, 1965), pp. 180-181, 361-370.

Halomethyl-1,3,5-triazines are known to be initiators for a number of photochemical reactions. They are employed to produce free radicals for initiating polymerization or color changes and for initiating secondary reactions upon liberation of acid by the interaction of the free-radicals when hydrogen donors are present.

Examples of the use of the halomethyl-1,3,5-triazines in the free radical polymerization of acrylate monomers are described in U.S. Pat. No. 3,905,815; U.S. Pat. No. 3,617,288; U.S. Pat. No. 4,181,752; U.S. Pat. No. 4,391,687; U.S. Pat. No. 4,476,215; and DE 3,517,440. U.S. Pat. No. 3,779,778 discloses the photoinitiated acid catalyzed decomposition of pyranyl ether derivatives to produce photosolubilizable compositions useful as positive printing plates. Chromophore substituted styryl-1,3,5-triazines and their uses are disclosed in U.S. Pat. No. 3,987,037 and U.S. Pat. No. 3,954,475.

Radiation sensitive compositions containing bi- and polyaromatic substituted triazines are disclosed in U.S. Pat. No. 4,189,323.

Typical photopolymerization initiators for polymerizable ethylenically unsaturated compounds include benzil, benzoin, benzoin ethyl ether, Michler's ketone, anthraquinone, acridine, phenazine, benzophenone, etc. For example, the use of photoinitiators such as benzoin ethers are described in U.S. Pat. No 2,722,512; anthraquinones are described in U.S. Pat. No. 3,046,127; amino phenyl ketones and active ethylene or amino compounds are described in U.S. Pat. No. 3,661,588; and Michler's ketone and benzophenone are described in U.S. Pat. No. 3,682,641.

Mixed photoinitiators have been disclosed for use with polymerizable monomers. A very effective mixed initiator system has been Michler's ketone admixed with benzophenone, as described in U.S. Patent No. 3,682,641. 3-Keto-coumarins have been shown to be effective mixed initiators with Michler's ketone, as described in U.S. Patent No. 4,366,228. Halogenated organic photoinitiators such as carbon tetrabromide, etc, have been used as co-photoinitiators with diazonium salts, as described in U.S. Pat. No. 4,113,497. Likewise, 5-isoxazolones are effective co-photoinitiators when used with aromatic carbonyl compounds in the presence of halomethyl-1,3,5-triazines, as described in U.S. Pat. No. 4,254,432. Other examples of specific combinations of known photoinitiators are disclosed in U.S Pat. Nos. 3,814,607; 3,673,140; 3,326,710; 3,847,771; 3,427,161; 3,915,824, and 4,264,709.

SUMMARY OF THE INVENTION

This invention provides radiation-sensitive organohalogen compounds having good sensitivity in the ultraviolet and visible range of the spectrum. These compounds are suitable for use in radiation-sensitive compositions. This invention provides compounds that have a photo-labile halomethyl-1,3,5-triazine moiety and an additional photoinitiator moiety within one molecule so as to eliminate the need- for a combination of photoinitiator compounds. The compounds of this invention are good photoinitiators. Photopolymerizable and photocrosslinkable compositions containing these photoinitiators can be used in printing, duplicating, copying, and other imaging systems.

This invention provides compounds having a 1,3,5-triazine moiety having at least one halomethyl substituent on a carbon atom of the triazine nucleus, preferably a trihalomethyl group, and at least one additional photoinitiator moiety attached to another carbon atom of the triazine nucleus that is capable of initiating free radical or ionic chain polymerization upon exposure to actinic radiation. Attachment of the photoinitiator moiety to a carbon atom of the triazine nucleus can be by any linking group, including a covalent bond, so long as the linking group is not a group that results in ethylenic conjugation with both the triazine nucleus and the photoinitiator moiety. Representative examples of such photoinitiator moieties include benzoin group, benzoin alkyl ether group, acetophenone group, dialkoxyacetophenone group, benzophenone group, fluorenone group, anthraquinone group, thioxanthone group, triarylsulfonium group, dialkylarylsulfonium group, diaryliodonium group, α-acyloxime group, azide group, diazonium group, 3-ketocoumarin group, bisimidazole group, or a halomethyl-1,3,5-triazine group covalently bonded to the first-mentioned halomethyl-1,3,5-triazine moiety. The compound is capable of being stimulated by actinic radiation at a wavelength of about 220 to 900 nanometers, whereby free radicals or acids or both are generated.

These compounds are useful as photoinitiators for photosensitive compositions and elements. Thus, they can be incorporated in photopolymerizable compositions and printing compositions useful for producing printing plates, such as lithographic plates, relief plates or gravure plates, photoresists and photographic elements, and photosensitive resist forming compositions with which visible images can be obtained upon exposure to light.

DETAILED DESCRIPTION OF THE INVENTION

As used herein, the term "photoinitiator moiety" means a moiety containing at least one group that is capable of initiating free radical or ionic chain polymerization upon exposure to actinic radiation.

Halomethyl-1,3,5-triazine compounds of this invention can be represented by the general formula I:

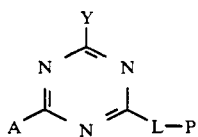

wherein

A represents a member selected from the group consisting of mono-, di- and trihalomethyl groups, Y represents a member selected from the group consisting of A, L-P, $NH_2$, NHR, $NR_2$, OR, and R', where R independently represents a substituted or unsubstituted alkyl group, preferable having 1 to 6 carbon atoms, or a substituted or unsubstituted aryl group, and R' represents a substituted or unsubstituted alkyl group, preferably having 1 to 6 carbon atoms, a substituted or unsubstituted aryl group, a substituted or unsubstituted alkenyl group, preferably having 2 to 6 carbon atoms, or a substituted or unsubstituted heterocyclic aromatic group, P represents a photoinitiator moiety that is capable of initiating free radical or ionic chain polymerization upon exposure to actinic radiation, and L represents a group or a covalent bond linking the photoinitiator moiety to the triazine nucleus.

Halomethyl groups that are suitable for the present invention include chloro-, bromo-, and iodomethyl groups, with chloro- and bromomethyl groups being preferred. Trihalomethyl groups are preferred; most preferred are trichloromethyl and tribromomethyl groups.

Y represents any of a variety of substituents that are useful in modifying the physical, e.g., solubility, or chemical properties of the molecule, and preferably represents A, L-P, or R'. When Y represents A, the maximum number of halomethyl groups per triazine nucleus can be made available for free radical generation. When Y represents L-P, the chemical composition for both L-P groups can be the same, or it can be different, depending on the composition of linking group L, photoinitiator moiety P, or both. When Y represents R', and in particular when R' represents an aryl, aralkenyl, or heterocyclic aromatic group, the spectral sensitivity of the molecule can be varied, based on the photochemical response of R' to actinic radiation.

When R or R' represents an aryl group it is preferred that the group have a maximum or five rings, more preferably three rings, and most preferably one ring.

When R or R' represents a substituted group, the particular identity of the substituents is not critical. However, the substituents should be selected so as not to adversely affect the photoinitiation characteristics or light sensitivity of the compounds of this invention.

P preferably represents at least one group selected from the group consisting of benzoin group, dialkoxyacetophenone group, benzophenone group, anthraquinone group, thioxanthone group, triarylsulfonium group, diaryliodonium group, α-acyloxime group, azide group, diazonium group, 3-ketocoumarin group, bisimidazole group, fluorenone group, or a halomethyl-1,3,5-triazine group covalently bonded to the triazine nucleus of formula I. There is no upper limit on the number of photoinitiator moieties per triazine nucleus; there is no upper limit on the number of triazine nuclei per photoinitiator moiety; however, there must be at least one photoinitiator moiety per triazine nucleus. Preferably, the number of photoinitiator moieties per triazine nucleus ranges from one to two or two to one; more preferably, there is one photoinitiator moiety per each triazine nucleus. If more than one photoinitiator moiety is present per triazine nucleus, they can be from different generic classes or can be different species from the same generic class. If more that one triazine nucleus is present per photoinitiator moiety, they can be of different species.

L represents a group that links the photoinitiator moiety or moieties to the triazine nucleus. The precise identity of L is not critical, but it should be selected so that it does not interfere with or adversely affect the photoinitation characteristics or light sensitivity of the compound. L can be formed from a single group or it can be formed from a combination of groups. In addition, L also includes a covalent bond. Groups that are suitable for linking groups include carbamato (—NHCO$_2$—), urea (—NHCONH—), amino (—NH—), amido (—CONH—), aliphatic, e.g., having up to 10 carbon atoms, alkyl, e.g., having up to 10 carbon atoms, haloalkyl, e.g., having up to 10 carbon atoms, alkenyl, e.g., having up to 10 carbon atoms, aryl, e.g., having one ring, styryl, ester (—CO$_2$—), ether (—O—), and combinations thereof. Based on ease of synthesis, the most preferred groups for attachment directly to the triazine nucleus are carbamato, urea, amino, alkenyl, aryl, and ether. When L represents an alkenyl group, i.e., CH=CH$_n$, it is required that the triazine moiety not be ethylenically conjugated with the photoinitiator moiety. Other types of conjugation, e.g., aromatic, carbonyl, are not intended to be excluded by the foregoing requirement.

The following list exemplifies typical -L-P group combinations:

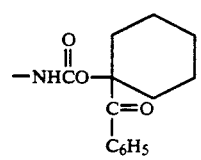

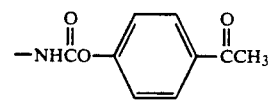

-continued
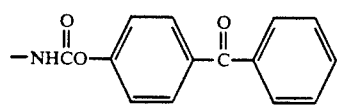
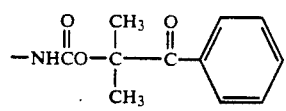
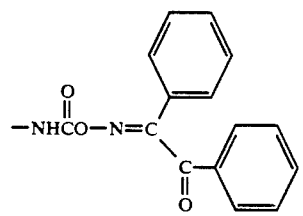
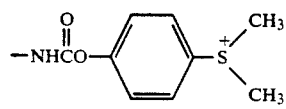
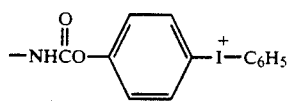
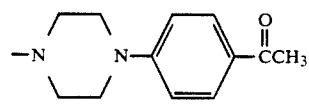
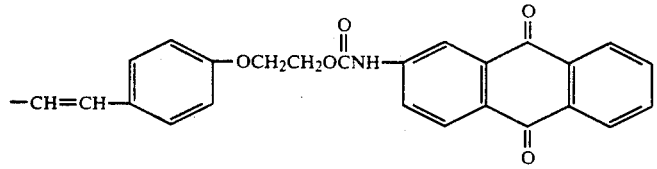
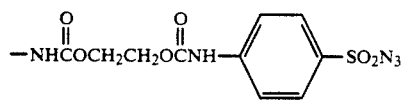
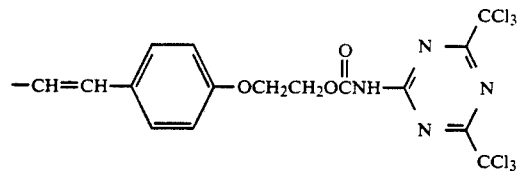
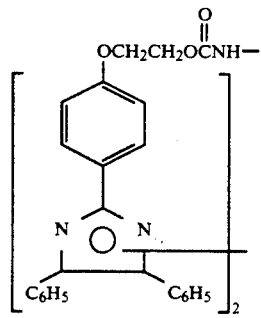
One method of preparing the compounds of this invention is by the addition reaction of isocyanato-sub- 2,4- bis(trichloromethyl)-6-isocyanato-1,3,5- triazine
2-isocyanato-4-methyl-6-trichloromethyl-1,3,5-triazine
2-isocyanator-4-phenyl-6-trichloromethyl-1,3,5-triazine
2-isocyanato-4-methoxy-6-trichloromethyl-1,3,5-triazine
2-isocyanato-4-(p-methoxyphenyl)-6-trichloromethyl 1,3,5-triazine
2-isocyanato-4-(p-methoxystyryl)-6-trichloromethyl-1,3,5-triazine
2-isocyanato-4-(m,p-dimethoxyphenyl)-6-trichloromethyl-1,3,5-triazine Typical photoinitiators that will combine with the isocyanato group include 1-benzoyl cyclohexanol (Irgacure® 184), 4-hydroxyacetophenone, 4-hydroxybenzophenone, 4-aminobenzophenone, 2-amino-9-fluorenone, 2-aminoanthraquinone, 2-hydroxymethylanthraquinone, 4'-piperidinoacetophenone, 4-hydroxydiphenyliodonium salt, dimethyl-4-hydroxyphenylsulfonium salt, and 2,4-bis(trichloromethyl)-6-hydroxyethylamino-1,3,5-triazine.

The isocyanate addition reaction can be carried out in the presence of solvents such as, for example, toluene, pyridine, benzene, xylene, dioxane, tetrahydrofuran, etc., and mixtures of solvents. The duration and temperature of the reaction is dependent on the particular compounds and the catalyst employed. Generally, temperatures ranging from about 25° C. to 150° C. for from one to seventy-two hours are sufficient to provide for the reaction. Preferably, the reaction is carried out at room temperature from three to seventy-two hours. The preferred catalyst is di-n-butyltin dilaurate.

Another method for preparing the compounds of this invention is the cotrimerization of organic nitriles having a photoinitiator substituent with haloacetonitriles in accordance with the teachings of Wakabayashi et al, Bulletin of the Chemical Society of Japan, 1969, 42, 2924-30. Still another method is the condensation reaction of an aldehyde compound having a photoinitiator functionality in accordance with the teachings of U.S. Pat. No. 3,987,037. Another method is the nucleophilic displacement reactions on halomethyl-1,3,5-triazines using photoinitiators having free hydroxy or amino groups.

The photoinitiators of this invention combine a halomethyl-1,3,5,-triazine moiety and another photoinitiator moiety in the same molecule, thereby eliminating the requirement of adding each type of photoinitiator separately. Synergism can be brought about in instances where the radicals produced by one moiety induce chain decomposition of the other moiety, thereby in effect, promoting the same reaction that would have been produced by a direct photoresponse.

Combinations of moieties can be selected that produce, upon exposure to actinic radiation, several different photoproducts, which will initiate the same reaction. For example, a halomethyl-1,3,5,-triazine moiety combined with a benzoin group can initiate free radical polymerization by generating halogen radicals and benzoyl radicals (along with other unidentified radical species).

Combinations of moieties can be selected that produce photoproducts which will initiate a multiplicity of reactions. For example, compounds derived from a halomethyl-1,3,5,-triazine and a sulfonium salt can produce both free radicals and Lewis acids to cure a mixture comprising acrylate and epoxy monomers.

Furthermore, the chromophore of each photoinitiator moiety can be selected so that each moiety can either (a) broadly respond to radiation, thereby allowing more efficient utilization of various light sources commercially available, or (b) narrowly respond to different wavelengths, thereby allowing stepwise initiation of multiple reactions. An example of the latter scheme would be to first irradiate the compound at a wavelength at which the halomethyl-1,3,5-triazine moiety absorbs light to initiate a free radical polymerization, and then subsequently irradiate the compound at a wavelength at which the other photoinitiator moiety absorbs light to initiate an ionic cross-linking reaction.

The sensitivity of compositions containing the compounds of this invention to actinic radiation of a particular range of wavelengths can be increased by the incorporation of ultraviolet and visible light sensitizers, such as, for example, cyanine, carbocyanine, merocyanine, styryl, acridine, polycyclic aromatic hydrocarbons, polyarylamines and amino-substituted chalcones. Suitable cyanine dyes are described in U.S. Pat. No. 3,495,987. Suitable styryl dyes and polyarylamines are described in Kosar, Light Sensitive Systems, J. Wiley and Sons (New York, 1965), pp 361-369. Polycyclic aromatic hydrocarbons useful as sensitizers, e.g. 2-ethyl-9,10-dimethoxyanthracene, are disclosed in U.S. Pat. No. 3,640,718. Amino substituted chalcones useful as sensitizers are described in U.S. Pat. No. 3,617,288. The compounds of this invention can be used in photosensitive compositions in combination with other photoinitiators including the benzophenones, benzoin ethers, thioxanthone, benzil, and Michler's ketone. The compounds of this invention can be substituted for the triazines used in conjunction with dialkylamino aromatic carbonyl compounds disclosed in U.S. Pat. No. 4,259,432, with 2-(benzoylmethylene)-5-benzothiazolidene thiazole-4-1 compounds disclosed in E application 0109291, May 23, 1984, with 3-keto-substituted coumarin compounds disclosed in U.S. Patent No. 4,505,793, with those described in U.S. Patent No. 4,239,850, Jpn. Kokai Tokkyo Koho JP 60 60,104 (85 60104), and Ger. Offen 2,851,641.

The photoinitiators of this invention can be used with photopolymerizable compositions comprising unsaturated, free radical initiated, chain propagating addition polymerizable compound, the photoinitiator of this invention, and, optionally, one or more fillers, binders, dyes, polymerization inhibitors, color precursors, oxygen scavengers, etc. The photoinitiators of this invention should be present in an amount sufficient to initiate polymerization of the polymerizable compound. For every 100 parts of polymerizable compound, there can be present from about 0.005 to about 10 parts of photoinitiator, from about 0 to about 200 parts of filler, from about 0 to about 200 parts of binder, and from about 0 to about 10 or more parts of dyes, polymerization inhibitors, color precursors, oxygen scavengers, etc., as may be needed for a particular use of the photopolymerizable composition. Preferably, per each 100 parts of polymerizable compounds, there are from 1 to 7.5 parts of photoinitiator and from 25 to 150 parts of binder.

Unsaturated, free-radical initiated, chain-propagating addition polymerizable compounds suitable for the compositions of this invention include alkylene or polyalkylene glycol diacrylates, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, pentaerythritol tetramethacrylate, pentaerythritol triacrylate, sorbitol hexacrylate; bis[1-(3-acryloxy-2-hydroxy)]-p-propoxyphenyl dimethylmethane, bis[1-(2-acryloxy)]-p-ethoxyphenyldimethylmethane, tris hydroxyethylisocyanurate trimethacrylate, the bis-acrylate and the bis-methacrylates of polyethylene glycols of molecular weight 200-500 and the like; unsaturated amides, e.g., methylene bis-acrylamide, methylene bis-methacrylamide, 1,6-hexamethylene bis-acrylamide, diethylene triamine trisacrylamide, beta-methacrylaminoethyl methacrylate; vinyl esters such as divinyl succinate, divinyl adipate, divinyl phthalate. The preferred unsaturated compounds include pentaerythritol tetracrylate, bis[p-(3-acryloxy-2-hydroxypropoxy)phenyl] dimethylmethane, and bis[p-(2-acryloxyethoxy)phenyl] dimethylmethane. Mixtures of these esters can be used as well as mixtures of these esters with alkyl esters of acrylic acid and methacrylic acid, including such esters as methyl acrylate, methyl methacrylate, ethyl acrylate, isopropyl methacrylate, n-hexyl acrylate, stearyl acrylate, allyl acrylate, diallyl phthalate, and the like.

To prepare the photosensitive compositions of this invention, the components can be admixed in any order and stirred or milled to form a solution or uniform dispersion. Photosensitive elements can be made by coating the photosensitive composition on a suitable base or support and drying the coating. The dry thickness of the coating typically ranges from about 0.00005 to about 0.075 inch.

Bases or supports for the photosensitive compositions include metals, e.g., steel and aluminum plates, sheets and foils, and films or plates composed of various film-forming synthetic or high polymers, including addition polymers, e.g. vinylidene chloride, vinyl chloride, vinyl acetate, styrene, isobutylene polymers and copolymers; linear condensation polymers e.g., polyethylene terephthalate, polyhexamethylene adipate, polyhexamethylene adipamide/adipate.

The invention will be more specifically illustrated by the following examples. All values of λmax were measured in tetrahydrofuran, unless otherwise indicated.

EXAMPLE 1

To a solution containing 0.01 mol 1-benzoyl cyclohexanol (Irgacure® 184) and 12 drops di-n-butyltin dilaurate in 40 ml dry toluene was added a solution of 0.01 mol 2,4-bis(trichloromethyl)-6-isocyanato-1,3,5-triazine in toluene. The reaction mixture was stirred at room temperature under $N_2$ for 24-72 hrs. The solvent was removed under reduced pressure by means of a rotary evaporator, and the residue was loaded upon a silica gel column (100 g packed with dichloromethane) and eluted with dichloromethane. The major compound was collected and the solvent was removed by means of a rotary evaporator to afford product. The product had a melting point of 115°-119° C. and a λmax of 236 nm. The structure of the product is shown below.

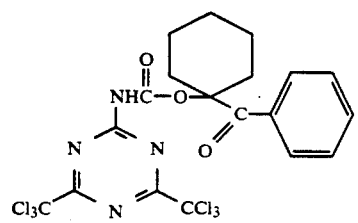

EXAMPLE 2

The procedure of Example 1 was repeated, with the only exception being that 4-hydroxyacetophenone was used instead of 1-benzoyl cyclohexanol. The product had a melting point of 140°-143° C. and a λmax of 280 nm, 234 nm. The structure of the product is shown below.

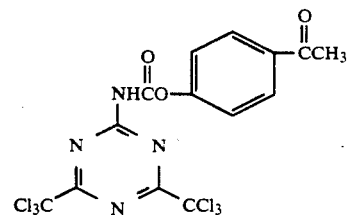

EXAMPLE 3

The procedure of Example 1 was repeated, with the only exception being that 4-hydroxybenzophenone was used instead of 1-benzoyl cyclohexanol. The product had a melting point of 105°-109° C. and a λmax of 288 nm, 234 nm. The structure of the product is shown below.

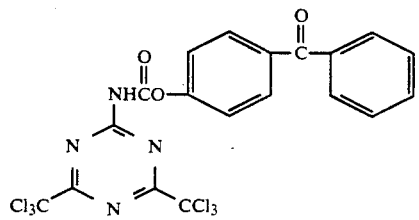

EXAMPLE 4

The procedure of Example 1 was repeated, with the only exception being that 4-aminobenzophenone was used instead of 1-benzoyl cyclohexanol. The product had a melting point of 225°-228° C. and a λmax of 298 nm, 234 nm. The structure of the product is shown below.

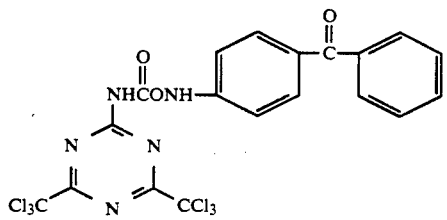

EXAMPLE 5

The procedure of Example 1 was repeated, with the only exception being that 2-aminoanthroquinone was used instead of 1-benzoyl cyclohexanol. The product had a melting point in exces of 260° C. and a λmax of 279 nm, 241 nm. The structure of the product is shown below.

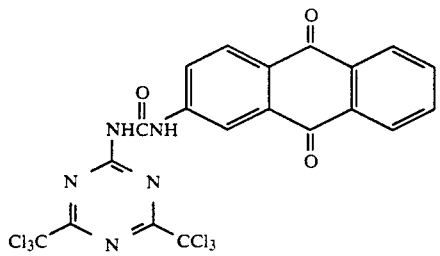

EXAMPLE 6

The procedure of Example 1 was repeated, with the only exception being that 2-(hydroxymethyl)anthroquinone was used instead of 1-benzoyl cyclohexanol. The product had a melting point of 253°–255° C. and a λmax of 255 nm. The structure of the product is shown below.

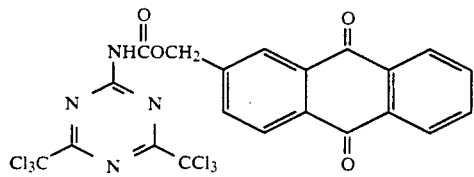

EXAMPLE 7

The procedure of Example 1 was repeated, with the only exception being that 2-amino-9-fluorenone was used instead of 1-benzoyl cyclohexanol. The product had a melting point in excess of 260° C. and a λmax of 266 nm. The structure of the product is shown below.

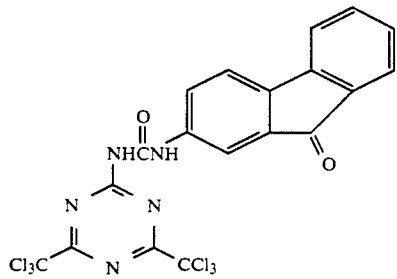

EXAMPLE 8

The procedure of Example 1 was repeated, with the only exception being that 4'-piperazinoacetophenone was used instead of 1-benzoyl cyclohexanol. The product had a melting point of 179°–182° C. and a λmax of 314 nm, 238 nm. The structure of the product is shown below.

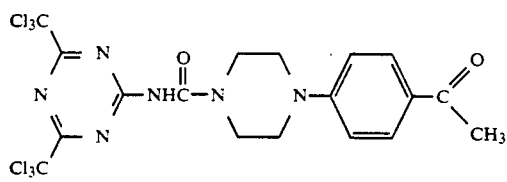

EXAMPLE 9

To a solution of 1.14 g (3.3 mmol) 2,4-bis(trichloromethyl)-6-isocyanato-1,3,5-triazine and 1.0 g (3.3 mmol) dimethyl-4-hydroxyphenylsulfonium hexafluorophosphate in 60 ml tetrahydrofuran was added 12 drops of di-n-butyltin dilaurate. The reaction was stirred at room temperature for 4 days and the solvent was removed on a rotary evaporator under reduced pressure. The residue was treated with hexane and the solid was filtered and dried to afford 1.01 g product. The product had a melting point of 160°–163° C. and a λmax of 242 nm. The structure of the product is shown below.

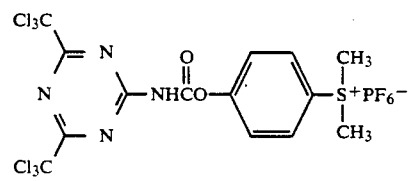

EXAMPLES 10

To a solution of 1 equivalent 2-amino-4,6bis(trichloromethyl) 1,3,5-triazine in dry toluene at 0° C. was added dropwise over a 15 minute period a solution of trichloroacetyl chloride in dry toluene. The resulting solution was heated at reflux under nitrogen atmosphere for three hours and cooled to room temperature. The solvent was reduced by means of a rotary evaporator under reduced pressure. The precipitate was filtered and dried to afford product. The product had a melting point of 101°–108° C. and a λmax of 239 nm. The structure of the product is shown below.

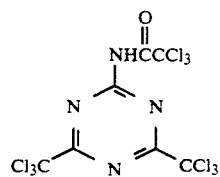

EXAMPLE 11

The procedure of Example 10 was repeated, with the only exception being that N,N'-bis-[2,4-bis(trichloromethyl)-1,3,5-triazinyl-(6)]-ethylenediamine was used instead of 2-amino-4,6-bis(trichloromethyl)-1,3,5-triazine. The product had a melting point of 209°–213° C. and a λmax of 274 nm. The structure of the product is shown below.

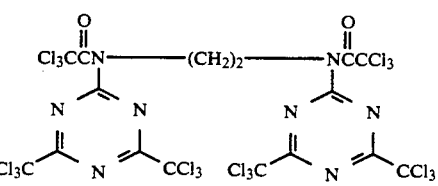

EXAMPLE 12

The procedure of Example 10 was repeated, with the only exception being that 2,6-bis-[2,4-bis(trichloromethyl)-1,3,5-triazinyl-(6)-amino]pyridine was used instead of 2-amino-4,6-bis(trichloromethyl)-1,3,5-triazine.

The product had a melting point of 243°–248° C. and a λmax of 324 nm, 233 nm. The structure of the product is shown below.

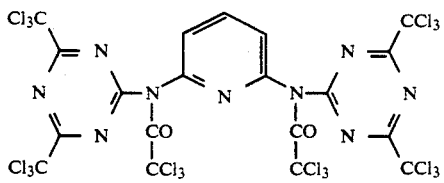

EXAMPLE 13

To a solution of 2.3 mmol 2,4,6-tris(trichloromethyl)-1,3,5-triazine in 25 ml toluene was added 1 equivalent 4'-piperazinoacetophenone. The reaction mixture was stirred at room temperature for 24 hours under nitrogen atmosphere. The solvent was removed by means of a rotary evaporator under reduced pressure, and the residue was dissolved in a small amount of dichloromethane and loaded upon a column of silica gel (100 g packed in hexane) and eluted with hexane. The appropriate fractions were pooled and the solvent was removed by means of a rotary evaporator to afford product. The product had a melting point of 152°–155° C. and a λmax of 312 nm, 240 nm. The structure of the product is shown below.

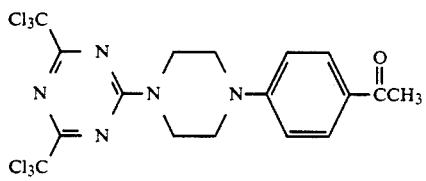

EXAMPLE 14

To a solution of 1.0 g (2.0 mmol) 2,4-bis(trichloromethyl)-6-[p-(2-hydroxyethoxy)styryl]-1,3, 5-triazine and 0.71 g (2.0 mmol) 2,4-bis(trichloromethyl)-6-isocyanato-1,3,5-triazine in 30 ml tetrahydrofuran was added 10 drops dibutyltindilaurate. The reaction mixture was stirred at room temperature for seventy-two hours. The solution was then concentrated on a rotary evaporator under reduced pressure. The precipitate was filtered and dried to afford 1.12 g product. The product had a melting point of 172°–174° C. The structure of the product is shown below.

This example illustrates the preparation of photosensitive elements using the halomethyl-1,3,5triazines of the present invention.

A solution was prepared from 74.24 g azeotrope of 1-propanol and water (71.8% 1-propanol/28.2% water), 4.32 g pentaerythritol tetraacrylate ("Sartomer" monomer SR-295, Arco Chemical Company), 5.64 g oligomer (prepared according to U.S. Pat. No. 4,228,232 and 60.9% in methyl ethyl ketone), 0.30 g triethylamine, and 14.88 g a 1:1 mixture of polyvinyl acetate-methylal resin ("Formvar" 12/85T, Union Carbide Corp.) and red pigment (Pigment Red 48, C.I. 15865) (9.4% by weight solution of the azeotrope). To 2.5 g of this solution was added 2.5 mg dimethylaminobenzylacetone (DMBA), 10 mg initiator, and the resulting solution shaken in the dark for 15 minutes. The solution was filtered through glass wool and coated onto a grained, anodized aluminum plate with a #12 Mayer bar. The plate was dried at 66° C. for 2 min and cooled to room temperature. To this was applied a topcoat formulation (prepared from 5.00 g carboxymethyl cellulose ether (CMC-7L), 0.26 g surfactant ("Triton" X-100 (10% in water)), and 95 g water with a #14 Mayer bar and carefully dried with a heat gun. The plates were exposed for 5 sec in air on top of a drawdown glass in a 3M Seventy exposure unit equipped with a 2 kw photopolymer bulb through a √2, 21 step Stouffer step tablet. The plates were soaked in the developer solution prepared from 784.40 g deionized water, 16.70 g sodium metasilicate pentahydrate, 33.40 g 1-propanol, and 0.50 g surfactant ("Dowfax-2A1", Dow Chemical Company) (45% solution in water) for 15 sec and rubbed 10 times with a 4 in. ×4 in. cotton pad. The relative sensitivities for triazines of Example 1–8, 10–12 are shown in Table 2.

TABLE 2

| Initiator | Solid Step |
|---|---|
| Example 1 | 13 |
| Example 2 | 10 |
| Example 3 | 9 |
| Example 4 | 8 |
| Example 5 | 8 |
| Example 6 | 8 |
| Example 7 | 13 |
| Example 8 | 12 |
| Example 10 | 13 |
| Example 11 | 13 |
| Example 12 | 13 |

Various modifications and alterations of this invention will become apparent to those skilled in the art without departing from the scope and spirit of this invention, and it should be understood that this invention is not to be unduly limited to the illustrated embodiment set forth herein.

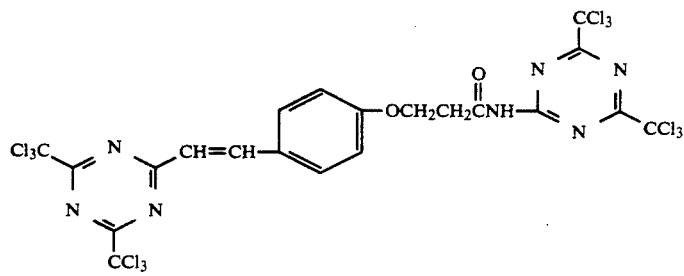

EXAMPLE 15

What is claimed is:

1. A compound having the formula:

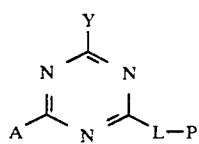

wherein:
- A represents a member selected from the group consisting of mono-, di- and trihalomethyl groups,
- Y represents a member selected from the group consisting of A, L-P, $NH_2$, NHR, $NR_2$, OR, and R', where R independently represents a substituted or unsubstituted alkyl group, or a substituted or unsubstituted aryl group, R' represents a substituted or unsubstituted alkyl group, a substituted or unsubstituted aryl group, a substituted or unsubstituted alkenyl group, or a substituted or unsubstituted heterocyclic aromatic group, provided that the substituents of R or R', if any, not adversely affect the photoinitiation characteristics or light sensitivity of said compound,
- P represents a photoinitiator moiety capable of initiating free radical or ionic chain polymerization upon exposure to actinic radiation, and
- L represents a group or a covalent bond linking the photoinitiator moiety to the triazine nucleus, provided that L must not interfere with or adversely affect the photoinitiation characteristics or light sensitivity of said compound, further provided that L not result in ethylenic conjugation with said triazine moiety and with said photoinitiator moiety, the portion of L directly attached to the triazine nucleus being selected from (a) carbon atom, (b) amino group selected from the group consisting of (1) aminoaryl groups wherein the nitrogen atom of the amino group is attached to the triazine nucleus and (2) an amino group wherein the nitrogen atom of the amino group is attached to both the triazine nucleus and the carbon atom of at least one —$CH_2CH_2$— group, and (c) oxygen atom.

2. The compound of claim 1 wherein A represents a triiodomethyl group.

3. The compound of claim 2 wherein the trihalomethyl group is a member selected from the group consisting of trichloromethyl, tribromomethyl, triiodomethyl.

4. The compound of claim 3 wherein the trihalomethyl group is a member selected from the group consisting of trichloromethyl and tribromomethyl.

5. The compound of claim 1 wherein the photoinitiator moiety is selected from the group consisting of benzoin group, benzoin alkyl ether group, acetophenone group, dialkoxyacetophenone group, benzophenone group, fluorenone group, anthraquinone group, thioxanthone group, triarylsulfonium group, diaryliodonium group, α-acyloxime group, azide group, diazonium group, 3-ketocoumarin group, bisimidazole group, and halomethyl-1,3,5-triazine group.

6. The compound of claim 1 wherein Y represents A.

7. The compound of claim 1 wherein Y represents L-P.

8. The compound of claim 1 wherein R' represents a substituted or unsubstituted aryl group.

9. The compound of claim 1 wherein R' represents a substituted or unsubstituted heterocyclic aromatic group.

10. The compound of claim 1 wherein R' represents a substituted or unsubstituted alkenyl group.

11. The compound of claim 6 wherein the carbon atom of the portion of said linking group directly attached to the triazine nucleus is a member of the group selected from the group consisting of alkyl groups, aliphatic groups, haloalkyl groups, alkenyl groups, aryl groups, styryl groups, ester groups (—$CO_2$—), and combinations of the foregoing.

* * * * *

UNITED STATES PATENT AND TRADEMARK OFFICE
CERTIFICATE OF CORRECTION

PATENT NO. : 5,153,323
DATED : October 6, 1992
INVENTOR(S) : Rossman et al.

It is certified that error appears in the above-indentified patent and that said Letters Patent is hereby corrected as shown below:

Item [56] References Cited:
Title page, first column, under "U.S. PATENT DOCUMENTS", please add:

| | | | |
|---|---|---|---|
| 3,326,710 | 6/1967 | Brodie | 117/62 |
| 3,427,161 | 2/1969 | Laridon et al. | 96/35.1 |
| 3,495,987 | 2/1970 | Moore | 96/115 |
| 3,617,288 | 11/1971 | Hartman | 96/90 |
| 3,640,718 | 2/1972 | Smith | 96/89 |
| 3,661,588 | 6/1972 | Chang | 96/86P |
| 3,673,140 | 6/1972 | Ackerman et al. | 260/22TN |
| 3,682,641 | 8/1972 | Casler et al. | 96/35.1 |
| 3,779,778 | 12/1973 | Smith et al. | 96/115R |

Title page, second column, under "FOREIGN PATENT DOCUMENTS", please add:

| | | |
|---|---|---|
| 0109291 | 6/1984 | European Pat. Off. |
| 3517440 | 11/1985 | Germany |
| 2851641 | 5/1979 | Germany |

Title page, second column, after the "FOREIGN PATENT DOCUMENTS" section, please add:

OTHER PUBLICATIONS

Kosar, *Light Sensitive Systems*, J. Wiley and Sons (New York 1965), pp. 361-369

U. Von Gizycki, *Angew. Chem. Int. Ed. Eng.*, 1971, 10, 403

Wakabayashi et al., *Bulletin of the Chemical Society of Japan*, 1969, 42, 2924

UNITED STATES PATENT AND TRADEMARK OFFICE
CERTIFICATE OF CORRECTION

PATENT NO. : 5,153,323
DATED : October 6, 1992
INVENTOR(S) : Rossman et al.

It is certified that error appears in the above-indentified patent and that said Letters Patent is hereby corrected as shown below:

Col. 1, line 5, "The" should be --This--.

Col. 1, line 6, "07/44,181" should be --07/441,181--.

Col. 7, line 1, add --stituted halomethyl-1,3,5-triazines with photoinitiators having groups reactive with the isocyanate group. The isocyanato substituted triazines may be prepared from the corresponding amino derivative according to the procedure of U. Von Gizycki, Angew. Chem. Int. Ed. Eng., 1971, 10, 403. Isocyanato-1,3,5-triazines suitable for this reaction include:--

Col. 7, line 3, "2-isocyanator-4" should be --2-isocyanato-4--.

Col. 12, line 26, "2-amino-4,6bis(tri-" should be --2-amino-4,6-bis(tri---.

Signed and Sealed this

First Day of November, 1994

Attest:

Attesting Officer

BRUCE LEHMAN

Commissioner of Patents and Trademarks